United States Patent
Wang

(10) Patent No.: US 6,680,468 B1
(45) Date of Patent: Jan. 20, 2004

(54) ELECTRICAL-SUPPLY-FREE MOS INTEGRATED CIRCUIT

(75) Inventor: Chunyan Wang, Montréal (CA)

(73) Assignee: Valorbec, Limited Partnership, Montreal (CA)

( * ) Notice: Subject to any disclaimer, the term of this patent is extended or adjusted under 35 U.S.C. 154(b) by 0 days.

(21) Appl. No.: 10/218,453

(22) Filed: Aug. 15, 2002

(51) Int. Cl.[7] .................................................. H01J 40/14
(52) U.S. Cl. ............................. 250/214 R; 250/214 S; 250/214 G; 327/350; 257/292; 257/293; 257/291
(58) Field of Search .......................... 326/83, 102, 117; 136/291, 293; 250/214 S, 214 G; 257/83, 106, 271; 307/117; 327/484, 514

(56) References Cited

U.S. PATENT DOCUMENTS

| | | | |
|---|---|---|---|
| 4,127,784 A | | 11/1978 | Proud, Jr. et al. |
| 4,295,058 A | | 10/1981 | Lade et al. |
| 4,523,217 A | | 6/1985 | Jibu |
| 4,701,646 A | | 10/1987 | Richardson |
| 4,857,727 A | | 8/1989 | Lenz et al. |
| 4,912,522 A | | 3/1990 | Oates et al. |
| 5,223,707 A | | 6/1993 | Bjork |
| 5,363,000 A | * | 11/1994 | Miyatake et al. ........... 327/350 |
| 5,436,553 A | | 7/1995 | Pepper et al. |
| 5,572,074 A | * | 11/1996 | Standley .................... 307/117 |
| 5,821,528 A | * | 10/1998 | Liao et al. .............. 250/214 R |
| 5,933,263 A | | 8/1999 | Kinstler |
| 6,043,525 A | * | 3/2000 | Chen .......................... 257/292 |

OTHER PUBLICATIONS

IEEE Photonics Technology Letters, vol. 1, No. 1, Jan. 1989 "Optically Powered Optical Interconnection System", Y. Liu et al., pp. 21–23.

* cited by examiner

*Primary Examiner*—Vibol Tan
(74) *Attorney, Agent, or Firm*—James Anglegart; Ogilvy Renault

(57) ABSTRACT

An electrical-supply-free MOS integrated circuit is described. The circuit comprises: a first semiconductor device having a first current terminal, a first input voltage terminal, and a first common terminal, said semiconductor device having a voltage between said first input voltage terminal and said first common terminal that controls a current flow leaving said first current terminal; and a first opto-electronic device having a first anode connected to said first current terminal and a first cathode connected to a ground to convert an input of incident light into an electrical signal, said first opto-electronic device having photodiode and photovoltaic cell capabilities; wherein a voltage is set between a node of said first current terminal and said first common terminal. The principle of the circuit operation can be used for developing optically controlled electrical-supply-free very large scale integrated circuits (VLSI) at low-cost. Potential applications include multi-channel transmissions of optical signals without electronic addressing, and optically and selectively distributions of timing and control signals.

12 Claims, 3 Drawing Sheets

ELECTRICAL-SUPPLY-FREE MOS INTEGRATED CIRCUIT

The present application claims priority under 35 U.S.C. Section 120 of PCT/CA02/01223 filed Aug. 5, 2002 designating the United States of America, now abandoned.

FIELD OF THE INVENTION

The invention relates to the design of silicon VLSI circuits. More specifically, it relates to the scheme of control and power supply of silicon VLSI circuits.

BACKGROUND OF THE INVENTION

Conventional Very Large Scale Integration (VLSI) circuits are driven by electrical signals and power supplies to perform designed functions, controls, and signal transfer. Optical power can be used as a supply source by means of certain devices, such as solar cells, or photovoltaic cells made of amorphous silicon or III-V elements [Y. Liu et al., "Optically powered optical interconnection system", IEEE Photonics Technology Letters, Vol. 1, no. 1, January 1989, pp 21–23]. Such devices, due to the limitations of semiconductor material, surface required and fabrication process, are not technologically compatible with highly compact VLSI circuits.

In U.S. Pat. No. 4,523,217, Jibu describes a solar powered circuit with CMOS and bipolar transistors. The solar cell provides a reference voltage to the base of the first bipolar transistor and a constant voltage circuit is provided in the substrate. In U.S. Pat. No. 4,701,646, Richardson describes using a photodiode for biasing or level-shifting.

However, little work has been reported on the design of optically controlled and simultaneously optically supplied VLSI circuits implementable in a CMOS process. CMOS is the type of technology used for most of the electronic circuits designed.

Moreover, since it is essential to keep up with the fast advances in technology, there is a need to develop VLSI circuits and systems without dedicated electrical power supply. There is also a need to efficiently solve problems of power distribution, interconnection, control, and interfacing in VLSI circuits.

SUMMARY OF THE INVENTION

Accordingly, an object of the present invention is to develop electrical-supply-free circuits and systems.

Another object of the present invention is to adjust voltage levels and produce large on-chip voltages without dissipating electrical power.

Yet another object of the present invention is to implement logic functions, optical and/or electrical signal routing and switching, as well as optical timing in digital CMOS circuits.

According to a first broad aspect of the present invention, there is provided a circuit comprising: a first semiconductor device having at least a first current terminal, a first input voltage terminal, and a first common terminal, said semiconductor device having a voltage between said first input voltage terminal and said first common terminal that controls a current leaving said first current terminal; and a first opto-electronic device having a first anode connected to said first current terminal and a first cathode connected to a ground to convert an input of incident light into an electrical signal, said first opto-electronic device having photodiode and photovoltaic cell capabilities; wherein a voltage is set between a node of said first current terminal that is connected to said first anode and said first common terminal.

Preferably, the circuit comprises a voltage booster module to set the input voltage of the semiconductor device at a biasing level.

According to a second broad aspect of the present invention, there is provided a method for controlling an electrical-supply-free integrated circuit, the method comprising: injecting optical energy into an opto-electronic device connected to a semiconductor device to supply power and act as an input; lowering a voltage at a node of the opto-electronic device and the semiconductor device to substantially zero by removing the injection of the optical energy into the opto-electronic device; lowering a voltage at the node to substantially zero by applying an electrical signal to set the semiconductor device in its on-state; raising a voltage at the node to a high level distinguished from zero volts by injecting optical energy into the opto-electronic device and applying an electrical signal to set the semiconductor device in its off-state.

According to a third broad aspect of the present invention, there is provided a method for locally powering multiple circuit elements on an integrated circuit using light, the method comprising: providing an opto-electronic device for each of the multiple circuit elements on the integrated circuit; projecting light onto a surface of the integrated circuit, each of the opto-electronic device converting the light into a voltage; using the voltage to supply power to the multiple circuit elements on the integrated circuit; wherein no power line is present on the integrated circuit for the multiple circuit elements.

According to a fourth broad aspect of the present invention, there is provided a method for selectively activating a plurality of groups of circuits interconnected on an integrated circuit chip using light, the method comprising: providing an opto-electronic power source means for each of the plurality of groups of circuits; selectively powering at least one of the groups of circuits by projecting the light onto selected ones of the opto-electronic means in order to define a function of the integrated circuit chip.

BRIEF DESCRIPTION OF THE DRAWINGS

These and other features, aspects and advantages of the present invention will become better understood with regard to the following description and accompanying drawings wherein.

DETAILED DESCRIPTION OF THE PREFERRED EMBODIMENT

Throughout this application, the preferred embodiment of the present invention will be referred to as a "basic cell" of a "VLSI circuit". It can be appreciated that although the preferred embodiment refers to a photodiode, the function performed may also be that of a photovoltaic cell.

Figure 1:
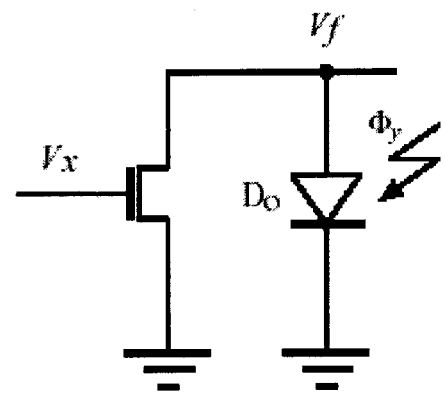
FIG. 1 is a circuit diagram of the basic cell.
Figure 2:
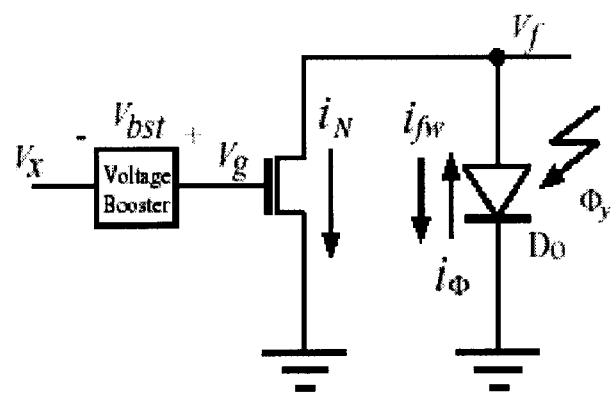
FIG. 2 is a circuit diagram of the basic cell with a voltage booster.

The circuit diagram of the basic cell is illustrated in FIG. 1. The cell is composed of a Metal Oxide Semiconductor (MOS) transistor and a photodiode, $D_o$, connected between the drain of the transistor and the ground. The output voltage of the cell, $V_f$, is determined by the input voltage $V_x$ and the incident light $\Phi_y$, which brings photons into the photodiode by shining on the area of the photodiode. The currents flowing through the output node $V_f$ are as shown in FIG. 2. The current $i_N$ is the transistor current. The photodiode has two current components. One is the photocurrent $i_\Phi$ which is the reverse current enhanced by the charges converted from the incident photons. The other is the forward current $i_{fw}$ which can become significant only when the photodiode is forward-biased.

When the photodiode is exposed to light, i.e. $\Phi_y > 0$, the basic cell can function in one of two ways. When $V_x$ is high enough for a good conducting channel to be created in the transistor, the transistor is turned on and a current path is established to circle the photocurrent $i_\Phi$. In this case, incoming photons contribute to reinforce the reverse current and no significant charge accumulation occurs across the photodiode. Consequently, $V_f \approx 0$, $i_{fw} \approx 0$, and $i_N \approx i_\Phi$. If $V_x$ is lowered, for instance, to 0 V, the conductivity of the transistor will be significantly reduced. In this case, $i_{Noff} < i_{Non} \approx i_\Phi$, wherein $i_{Noff}$ is the transistor current when the transistor is off and $i_{Non}$ is the transistor current when the transistor is on. The current difference between $i_\Phi$ and $i_{Noff}$ results in an accumulation of photo-charge across the PN junction of the photodiode. Then, as a consequence of the charge accumulation, $V_f$ becomes more positive and the photodiode gets more forward biased, raising the forward current $i_{fw}$. As soon as $V_f$ becomes positive enough to make $i_{fw} = i_\Phi - i_{Noff}$, the charge accumulation stops and $V_f$ stops rising. Therefore, when $V_x$ is low, the level of $V_f$ in steady state depends on the difference between the photocurrent, which is related to the incident power, and the "off-state" current of the MOS transistor. With a given level of illumination, the maximum level of $V_f$ can be obtained when the transistor is well cut-off: $i_{Noff} = 0$, and $i_{fw} = i_\Phi$.

When there is no optical radiation incident on the photodiode, $\Phi_y = 0$, i.e. the logic signal y=0, regardless of the level of the input voltage, the output voltage $V_f$ will not be in the high level. The cell is therefore not activated.

The level of the output voltage $V_f$ of the basic cell results from a comparison between the photocurrent $i_\Phi$ and the transistor current $i_N$. The former depends on the illumination $\Phi_y$ and the latter is controlled by the input voltage $V_x$. The level of $V_f$ will be significantly higher than 0 V when $i_N \ll i_\Phi$. This happens only if $V_x$ is low enough for $i_{Noff}$ to be a minimum and, at the same time, the photodiode is illuminated. It should be stressed that, if the condition ($i_{Noff} \ll i_\Phi$) is not satisfied, the circuit may not be able to operate correctly. For instance, if the transistor gate is too short and the photodiode $D_o$ is too tiny, the difference between the off-state current $i_{Noff}$ and the photocurrent $i_\Phi$ may not be significant enough to cause a charge accumulation in $D_o$, and the output voltage may not be able to rise from 0 V. Therefore, the parameters of the devices should be calculated to estimate the range of the currents. A test circuit involving several cells described above has been designed, fabricated, and tested with successful results. In this test circuit, the length of gate of the MOS transistor is 0.35 $\mu$m, the diode, composed of P-diffusion and N-well layers, occupies a space of 4.3 $\mu m^2$, and the amplitude of the output voltage reached 400 mV with room illumination.

If $V_x$ and $\Phi_y$ are binary signals, the logic function f=(!x)y is performed in this cell. The signal $\Phi_y$ can be considered as the enable signal activating the cell performing an inversion function.

The low level of the output voltage is approximately 0 V. Its high level can be between 0.4 and 0.5 V under normal illumination condition. The NMOS transistor operates in a subthreshold mode. The characteristic of the current versus the gate-to-source voltage is approximately exponential. If the voltage swing of $V_x$ is 400 mV, the current ratio $i_{Non}/i_{Noff}$ will be greater than $10^4$, which is enough to distinguish the two logic states if the circuit is used for logic operations. Therefore, despite the small voltage swing of $V_x$, the circuit operation is robust. Furthermore, the cell does not dissipate any power from electrical sources. The high level of the output voltage $V_f$ is set up with the energy carried by the signal $\Phi_y$. Therefore, the incident light plays two roles simultaneously: a data/control signal and the power supply of the basic cell.

The basic cell can be cascaded with other basic cells, i.e. the voltage $V_f$ can be applied to the input terminal of a cell of the same structure as the basic cell. If the circuit is fabricated using a technology in which the nominal zero-bias threshold voltage of the transistors is low, such as 0.4 V, no voltage boost will be needed. However, certain transistors may have a high threshold voltage, such as 0.6 V. In this case, if the input voltage swings between 0 and 0.4 V, the transistor will always be in the same state: off. In this case, in order to change the state of the transistor a voltage booster module is connected to the gate of the transistor. This is shown in FIG. 2. This voltage booster module add a negative voltage shift to the gate of the transistor. With the module, the effective threshold voltage of the transistor decrements by $V_{bst}$. Therefore, the transistor can be turned on even if the nominal threshold voltage of the transistor is greater than the input voltage of the cell.

Figure 3:
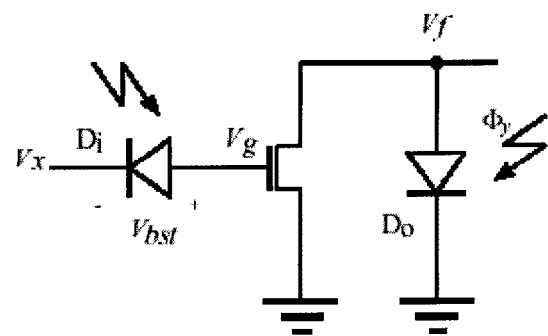
FIG. 3 is an embodiment of a voltage booster.

FIG. 3 shows one embodiment for the voltage booster. To boost the voltage level, a photodiode, of which the anode is connected to the gate of the transistor, is used. When the diode, $D_i$, is illuminated, voltage $V_{bst}$ is about +0.4 V, established by means of the photovoltaic effect. If multiple photodiodes are connected in series to the MOS gate, a larger $V_{bst}$ will be obtained. Therefore, besides functioning as a data/control input and a power supply, the incident light can also be used simultaneously to boost voltage levels. The area of $D_i$ can be very small. The potential difference can be easily established between the two electrodes of the diode even with a very low illumination. Moreover, this level boost does not take any power from any electrical source.

Figure 4:
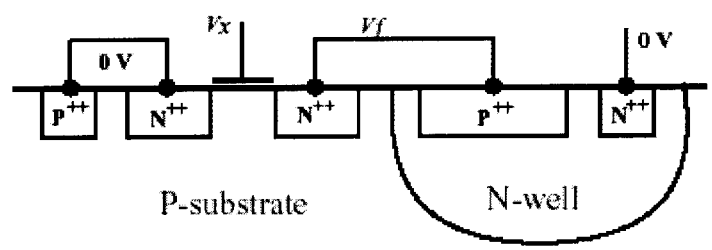
FIG. 4 is a CMOS implementation of FIG. 1.
Figure 5:
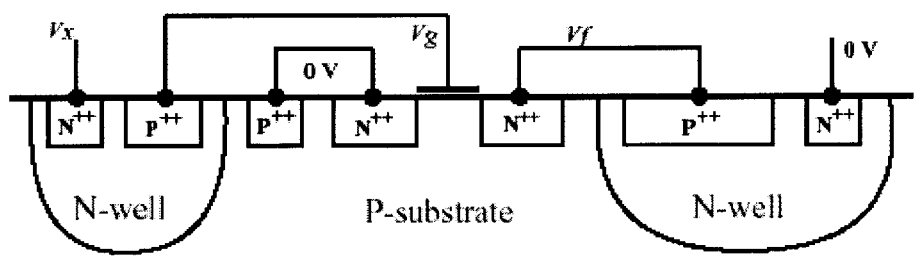
FIG. 5 is a CMOS implementation of FIG. 3.

The circuit consisting of the basic cells can be implemented in a standard CMOS process. FIGS. 4 and 5 illustrate, respectively, the implementations of the basic cells shown in FIGS. 1 and 3 using an N-well CMOS technology. The basic cell can be used to generate large on-chip voltages. This approach is significant when the circuit is wireless and/or electrical-supply-free.

Figure 6:
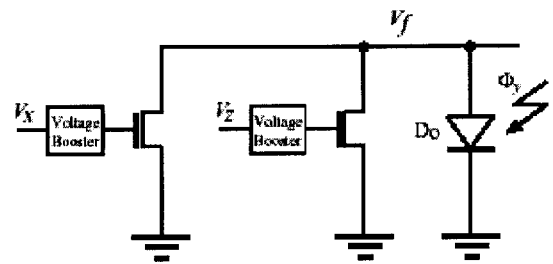
FIG. 6 is a logic function implemented with the basic cell.
Figure 7:
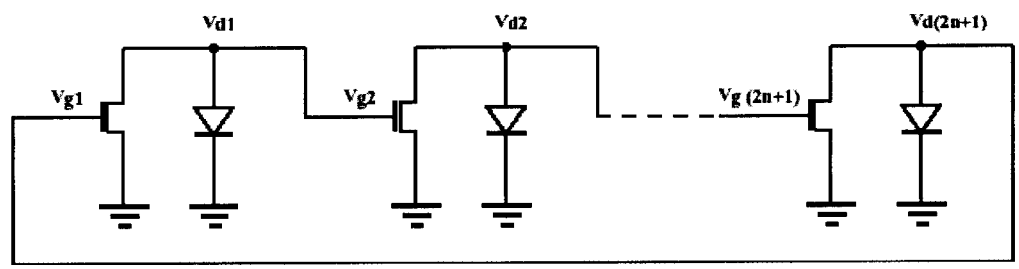
FIG. 7 is a ring oscillator implemented with the basic cell.

Many schemes can be devised for designing electrical-supply-free VLSI circuits on the basis of the basic cell. The principle of the basic cell can lead to a new approach of VLSI design and to a practical implementation of electrical-supply-free circuits. A logic function is one such scheme. FIG. 6 illustrates using a basic cell and two voltage boosts modules to realize a NOR gate. (the voltage boost modules may not be needed in some cases) The logic function, f=(notx)(notz)y, is implemented. Another circuit easily implemented with the basic cell is an optically controlled signal generator. FIG. 7 illustrates how a ring oscillator can be realized using the basic cell. An odd number of the basic cells are cascaded together and the final output voltage is fed back into the gate of the first transistor. The frequency of the oscillator is related to the number of basic cells, and in particular, controlled by the intensity of the incident light. The delay of the inverter cells is determined by the speed of the charge accumulation which depends on the rate of incident photon flow.

Optical system timing and control can also be implemented using the basic cell. With each cell having an optical enable input, the distribution of timing and control signals and the placement of the control units in the conventional electronic circuits can be simply replaced by projections of optical control signals on specific circuit areas. Using optical signals for remote control is an example.

Another possibility is using the basic cell for optical data transmission to a silicon multi-port reception/processing circuit. If the circuit blocks are integrated in the same silicon base to receive different optical signal beams, aiming a signal beam at its destination circuit area activates the data reception and processing in this part of the circuit. The signals can get their respective destinations without electronic addressing.

Furthermore, the circuit operations can be programmed by projecting optical beams carrying timing consequences.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

What is claimed is:

1. A method for controlling an electrical-supply-free integrated circuit, said method comprising:

injecting optical energy into an opto-electronic device connected to a semiconductor device to supply power and act as an input;

lowering a voltage at a node of said opto-electronic device and said semiconductor device to substantially zero by removing the injection of the optical energy into said opto-electronic device;

lowering a voltage at said node to substantially zero by applying an electrical signal to set said semiconductor device in its on-state;

raising a voltage at said node to a high level distinguished from zero volts by injecting optical energy into said opto-electronic device and applying an electrical signal to set said semiconductor device in its off-state.

2. A method as claimed in claim 1, wherein said semiconductor device is a field effect transistor.

3. A method as claimed in claim 2, wherein said electrical signal is a binary voltage signal.

4. A method as claimed in claim 1, further comprising adjusting threshold properties of said semiconductor device by injecting optical energy in a second opto-electronic device connected to a voltage input of said semiconductor device.

5. A method as claimed in claim 1, wherein said opto-electronic device is a diode open to receive incident light.

6. A method for locally powering multiple circuit elements on an integrated circuit using light, said method comprising:

providing an opto-electronic device for each of said multiple circuit elements on said integrated circuit;

projecting light onto a surface of said integrated circuit, each of said opto-electronic device converting said light into a voltage;

using said voltage to supply power to said multiple circuit elements on said integrated circuit;

wherein no power line is present on said integrated circuit for said multiple circuit elements.

7. A method as claimed in claim 6, wherein said opto-electronic devices are diodes open to receive incident light.

8. A method for selectively activating a plurality of groups of circuits interconnected on an integrated circuit chip using light, said method comprising:

providing an opto-electronic power source means for each of said plurality of groups of circuits;

selectively powering at least one of said groups of circuits by projecting said light onto selected ones of said opto-electronic means in order to define a function of said integrated circuit chip.

9. A method as claimed in claim 8, wherein integrated circuit is implemented in a metal-oxide-semiconductor technology.

10. A method as claimed in claim 8, wherein said opto-electronic means are diodes open to receive incident light.

11. A method as claimed in claim 10, wherein said providing an opto-electronic means further comprises providing a plurality of opto-electronic devices for each of said plurality of groups of circuits, said plurality of opto-electronic devices connected together in series.

12. A method as claimed in claim 8, wherein projecting light onto said opto-electronic device further comprises providing a data signal for each of said plurality of groups of circuits.

* * * * *